United States Patent [19]

Ramde et al.

[11] Patent Number: 4,512,816
[45] Date of Patent: Apr. 23, 1985

[54] HIGH-DENSITY IC ISOLATION TECHNIQUE CAPACITORS

[75] Inventors: Amolak R. Ramde, San Jose; Wadie N. Khadder, Sunnyvale; Surinder Krishna, Fremont, all of Calif.

[73] Assignee: National Semiconductor Corporation, Santa Clara, Calif.

[21] Appl. No.: 602,264

[22] Filed: Apr. 23, 1984

Related U.S. Application Data

[63] Continuation of Ser. No. 352,630, Feb. 26, 1982, abandoned, which is a continuation of Ser. No. 149,203, May 12, 1980, abandoned.

[51] Int. Cl.$^3$ .................... H01L 21/265; H01L 21/20
[52] U.S. Cl. .................................. 148/1.5; 29/576 B; 148/187; 357/34; 357/91
[58] Field of Search ............... 148/1.5, 187; 357/34, 357/91; 29/576 B

[56] References Cited

U.S. PATENT DOCUMENTS

| | | | |
|---|---|---|---|
| 3,752,715 | 8/1973 | Antipov et al. | 148/191 |
| 3,933,528 | 1/1976 | Sloan, Jr. | 148/1.5 |
| 4,087,900 | 5/1978 | Yiannoulos | 148/191 |
| 4,111,726 | 9/1978 | Chen | 148/175 |
| 4,233,615 | 11/1980 | Takemoto et al. | 357/43 |
| 4,295,898 | 10/1981 | Yoshida et al. | 148/1.5 |

OTHER PUBLICATIONS

Raheja, IBM-TDB, 21, (1978), 1439.
Muggli, IBM-TDB, 24, (1981), 997.

*Primary Examiner*—Upendra Roy
*Attorney, Agent, or Firm*—Gail W. Woodward; Paul J. Winters; Michael J. Pollock

[57] ABSTRACT

A semiconductor substrate having an epitaxial layer on its upper surface is provided with a masking layer. Holes are photolithographically etched in the masking layer where isolation diffusion regions are to be formed. Then aluminum ions are implanted into the surface and diffused completely through the epitaxial layer so as to create tubs of epitaxial material that are PN junction isolated. Since aluminum is a fast diffuser, the diffusion time is greatly reduced, thereby reducing the up diffusion of buried N+ collector so that the original epitaxial layer can be made relatively thin. Lateral isolation diffusion is reduced, thereby substantially reducing the surface area required for isolation. Thus, the process is capable of increasing the component density in the completed integrated circuit.

5 Claims, 7 Drawing Figures

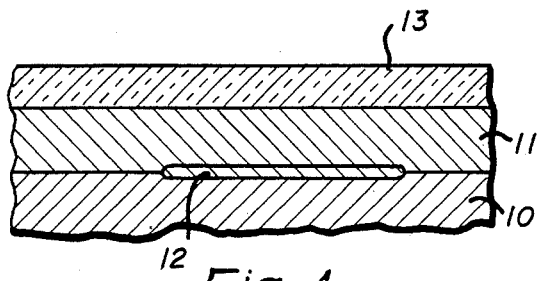
Fig_1
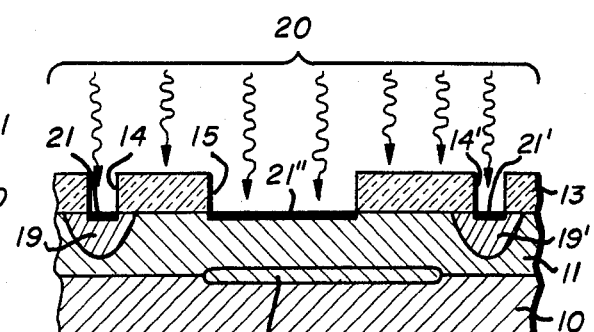
Fig_5
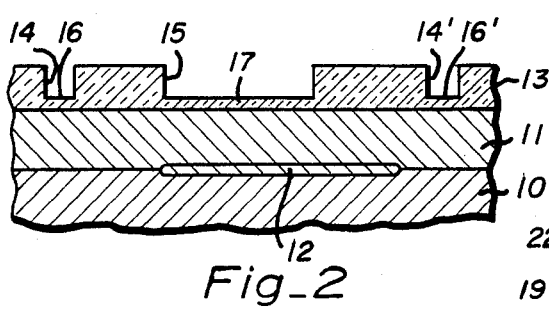
Fig_2
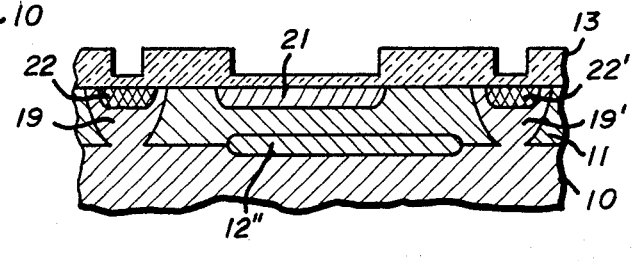
Fig_6
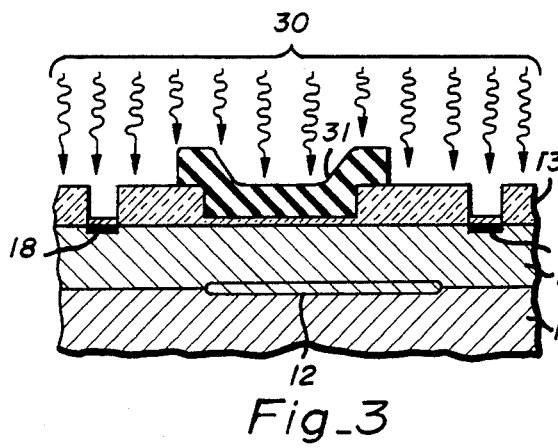
Fig_3
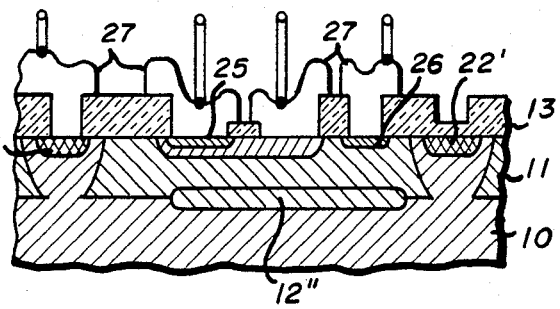
Fig_7
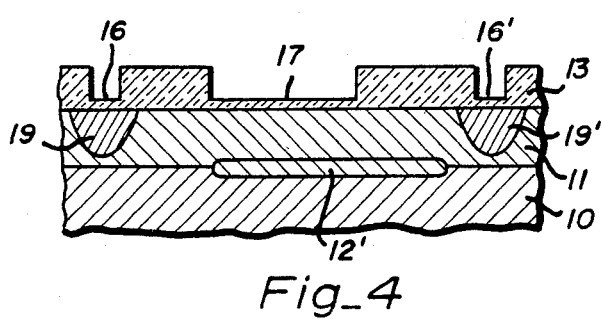
Fig_4

HIGH-DENSITY IC ISOLATION TECHNIQUE CAPACITORS

This is a continuation of application Ser. No. 352,630, filed on Feb. 26, 1982, which is a continuation of Ser. No. 149,203, filed on May 12, 1980, and both now abandoned.

BACKGROUND OF THE INVENTION

The invention relates to the manufacture of monolithic integrated circuit (IC) structures of the kind that employ isolation diffusion to electrically isolate devices. In the typical IC, an epitaxial semiconductor layer is grown onto an opposite conductivity type wafer. Before such epitaxy, the active device regions are provided with doping of a conductivity type opposite to that of the wafer. This creates a high conductivity buried layer or insert under the epitaxial layer which acts to reduce parasitic resistance in the finished circuit. While the buried layers are created using slow diffusing impurity materials, they tend to expand into the epitaxial layer during subsequent high temperature processing, particularly the oxidation and diffusion steps. This, in turn, means that the epitaxial layer must be made relatively thick. Then the isolation diffusion must be made long enough for the impurities to completely penetrate the thick epitaxial layer. Since diffusion penetrates laterally as well as vertically, the isolation diffusion normally requires substantial surface area.

SUMMARY OF THE INVENTION

It is an object of the invention to employ a fast diffusing isolation impurity so as to reduce the diffusion time in a PN junction isolated monolithic IC.

It is a further object of the invention to employ thinner epitaxial layers in PN junction isolated monolithic IC's so as to reduce the area requirements of the isolation.

It is a still further object of the invention to augment isolation diffusion in a PN junction isolated monolithic IC with a self-aligned transistor base diffusion.

These and other objects are accomplished as follows. A silicon substrate wafer is provided with high-density impurity regions of an opposite conductivity type and an epitaxial layer of the opposite conductivity type applied thereon. A masking oxide is then grown on the epitaxial layer and photolithographically contoured to define the isolation regions and the transistor base regions in the IC elements. Then a thin oxide is grown over the thus exposed silicon and the transistor bases covered with a layer of photoresist. Then aluminum is ion implanted through the thin oxide into the epitaxial layer. However, the thick oxide and the photoresist prevent the aluminum from contacting the silicon under them. Then the photoresist is removed and the aluminum partly diffused into the epitaxial layer. The thin oxide is stripped off and boron diffused into both the transistor base regions and the isolation regions which are automatically aligned by the openings in the oxide. After the base diffusion is completed, the isolation diffusion will have penetrated the epitaxial layer, thereby providing the desired isolation. Then conventional IC processing is employed to complete the structure. Since the diffusion co-efficient of aluminum is about six times higher than that of the conventional boron, the isolation diffusion time is correspondingly reduced. We have discovered that the use of ion-implanted aluminum permits a reduction of epitaxial-layer thickness of well over 40% to be achieved. A similar improvement in reduced isolation width is also realized, thereby improving circuit density by over 40% on some complex chips. We have also discovered that ordinary methods of depositing aluminum for isolation diffusion are not controllable and that ion implanting the aluminum through a thin oxide produces a repeatable isolation diffusion useful in practicing the invention.

BRIEF DESCRIPTION OF THE DRAWING

FIGS. 1-7 are fragmentary cross sections of a semiconductor wafer showing the various steps of the process. The drawings are not to scale but are exaggerated vertically to better illustrate the structure.

DESCRIPTION OF THE INVENTION

With reference to FIG. 1, a P-type silicon substrate 10 is overcoated with an N-type epitaxial layer 11. Prior to epitaxy, a layer 12 of N-type slowly diffusing impurity such as antimony or arsenic is applied to the wafer in those regions where active devices will be constructed. A relatively thick oxide 13 is then grown on top of epitaxial layer 11.

As shown in FIG. 2, holes 14, 14', and 15 are photolithographically etched through oxide layer 13 and a thin oxide at 16, 16', and 17 is grown over the silicon at the bottom of the holes. Hole 15 is located over buried layer 12 and represents the location of an active device to be subsequently established. Holes 14 and 14' are actually the cross section of an isolation ring that surrounds the active device.

Then, as shown in FIG. 3, a layer of photoresist 31 is applied over hole 15 to act as an implantation mask. Aluminum ions 30 are implanted at sufficient energy to penetrate the thin oxide. However, they will be masked by the thick oxide 13 and photoresist mask 31. This results in a relatively heavily doped aluminum region of 18 and 18'.

As shown in FIG. 4, the photoresist mask is removed and the wafer heated so as to partially diffuse the ion-implanted aluminum as shown at 19 and 19'.

Then, as shown in FIG. 5, the thin oxide at 16, 16', and 17 is stripped off and boron impurities 20 predeposited in accordance with conventional IC transistor base diffusion. The result is illustrated in FIG. 5 at 21, 21', and 21". It will be noted that hole 15 provides the base diffusion mask while holes 14 and 14' automatically align the base predeposition with the isolation impurities at 19 and 19'.

As shown in FIG. 6, the base diffusion drive-in establishes base region 21 and at the same time diffuses impurities at 22 and 22' into isolation regions 19 and 19'. During the base drive-in, the isolation diffusions 19 and 19' completely penetrate through epitaxial layer 11. The base diffusion at 22 and 22' enhances the P-type impurity concentration of the isolation. While not shown, it is to be understood that the silicon surface under the regrown oxide will be slightly depressed.

Since high-temperature processing has been employed, buried layer 12 of FIG. 1, even though it is selected to employ a slow diffuser in silicon, will have expanded as shown as 12' and 12" of FIGS. 4 and 6 respectively. As can be seen in FIG. 6, regions 12" and 21 approach each other. Their final spacing must be great enough to support the device operating voltage. Thus, it is clear that for a given device voltage capability, epitaxial layer 11 must be thick enough to space layers 21 and 12" apart by the desired distance. In conventional IC construction where boron is used for isolation diffusion, the high-temperature processing must be sufficient to cause complete epitaxial layer penetration. During this diffusion layer 12" grows thicker, thus requiring a thicker epitaxial layer. For a conventional device, layer 12 is relatively thick, which means that the width of the isolation is comparable to the depth. This results in a substantial loss of operating surface area. By using aluminum as the isolation diffusion impurity, we have discovered that a much thinner epitaxial layer can be used and this produces a corresponding reduction in wasted surface area. The normal methods of applying aluminum for diffusion have proven to be unreliable. However, ion implantation applied through a thin oxide provides an unexpectedly useful approach. For reasons not completely understood, we have found that the aluminum, applied as described above, does not diffuse laterally as much as it does vertically. In fact, the lateral diffusion can be as low as 50% of the vertical diffusion so that an even greater reduction in isolation surface area is achieved. By comparison, using boron isolation diffusion, the lateral diffusion is over 80% of the vertical.

As shown in FIG. 7, N+ diffusions 25 and 26, of conventional emitter construction, act to create transistor emitter and collector contacts respectively. Conventional aluminum metallization at 27 makes contact to the various elements where desired. At this stage of IC manufacture, conventional processing is used to complete the IC and may include surface passivation coatings and/or additional insulator and conductor layers.

EXAMPLE

Illustrative of a preferred embodiment, the above-described process was employed as follows. A silicon starting wafer 10 of 4 ohm centimeter P-type conductivity was provided with buried layer arsenic to a level of 20 ohms per square. Epitaxial layer 11 was 9 microns thick and oxide layer 13 was 0.6 micron thick. The thin oxide at the bottoms of holes 14, 14', and 15 was about 1000 Å thick. Aluminum 17 of FIG. 3 was ion implanted at 200 kV to a dose of $1 \times 10^{14}$ atoms per square centimeter. The heating step of FIG. 4 was 1150 degrees C. was for about 250 min. The boron diffused base of FIG. 6 was to a depth of about 2 microns and had a surface concentration of about $2 \times 10^{18}$ atoms per cm$^3$.

When the same structure was used with the conventional prior art boron isolation diffusion, the epitaxial layer had to be about 17 microns thick for the same collector voltage transistors. This means that the isolation diffusion can be made to occupy a greatly reduced area so that the circuit density can be approximately doubled.

The invention has been described and a particular example detailed. Upon reading the foregoing, alternatives and equivalents, that are within the spirit and intent of the invention, will occur to a person skilled in the art. Accordingly, it is intended that the scope of the invention be limited only by the following claims.

We claim:

1. In the process for creating an isolation diffusion in a monolithic integrated semiconductor device which includes active transistors that have emitter, base and collector regions, wherein a thin epitaxial layer of semiconductor is deposited upon an opposite conductivity type semiconductor substrate and employing a slow diffusing impurity type buried layer, the steps comprising:

forming a masking oxide layer over said epitaxial layer;

removing said masking oxide in those areas where isolation diffusion is desired and in those areas where transistor bases are desired whereby said transistor bases are automatically aligned with respect to said isolation;

temporarily masking the areas in which transistor bases are desired;

ion implanting a fast diffusing impurity species into said thin epitaxial layer in said areas of isolation diffusion; and heating said semiconductor to diffuse said fast diffusing impurity completely through said epitaxial layer whereby the penetration of said buried layer into said epitaxial layer is minimized permitting a reduced thickness epitaxial layer to about 9$\mu$.

2. The process of claim 1 wherein said epitaxial layer is N-type silicon, said substrate is P-type silicon and said fast diffusing impurity is aluminum.

3. The process of claim 1 wherein said ion implantation is achieved through a thin layer of silicon oxide.

4. The process of claim 2 wherein most of the diffusion of said fast diffusing impurity occurs during the formation of said transistor base regions in said integrated semiconductor device.

5. The process of claim 4 wherein the formation of said transistor bases is performed so that the transistor base impurities are simultaneously deposited in said areas of isolation diffusion thereby to increase the conductivity thereof.

* * * * *